(12) United States Patent
Yamada (10) Patent No.: US 8,089,201 B2
(45) Date of Patent: Jan. 3, 2012

(54) CONTOUR RESONATOR

(75) Inventor: Akinori Yamada, Ina (JP)

(73) Assignee: Seiko Epson Corporation, Tokyo (JP)

( * ) Notice: Subject to any disclaimer, the term of this patent is extended or adjusted under 35 U.S.C. 154(b) by 220 days.

(21) Appl. No.: 12/522,822

(22) PCT Filed: Jan. 10, 2008

(86) PCT No.: PCT/JP2008/000015
§ 371 (c)(1),
(2), (4) Date: Aug. 10, 2009

(87) PCT Pub. No.: WO2008/084763
PCT Pub. Date: Jul. 17, 2008

(65) Prior Publication Data
US 2010/0001621 A1    Jan. 7, 2010

(30) Foreign Application Priority Data

Jan. 12, 2007   (JP) ................. 2007-004321
Nov. 6, 2007   (JP) ................. 2007-288142

(51) Int. Cl.
*H01L 41/047* (2006.01)
(52) U.S. Cl. .......... 310/365; 310/361; 310/363
(58) Field of Classification Search ........ 310/361, 310/363, 365
See application file for complete search history.

(56) References Cited

U.S. PATENT DOCUMENTS

| | | | | |
|---|---|---|---|---|
| 2,497,665 | A | * | 2/1950 | Gravley .......... 29/25.35 |
| 7,323,803 | B2 | * | 1/2008 | Kando ........... 310/313 A |
| 2007/0252485 | A1 | * | 11/2007 | Kawakubo et al. ........ 310/365 |
| 2008/0024042 | A1 | * | 1/2008 | Isobe et al. ............ 310/365 |
| 2008/0252178 | A1 | * | 10/2008 | Yamada ............. 310/361 |
| 2009/0102322 | A1 | * | 4/2009 | Akane et al. ........... 310/348 |
| 2010/0096951 | A1 | * | 4/2010 | Yamada ............. 310/340 |

FOREIGN PATENT DOCUMENTS

| | | | | |
|---|---|---|---|---|
| JP | A-52-149084 | | 12/1977 | |
| JP | 1-149608 | * | 6/1989 | ......... 333/187 |
| JP | 01-149608 A | * | 6/1989 | ......... 333/187 |
| JP | A-7-162053 | | 6/1995 | |
| JP | A-8-97667 | | 4/1996 | |
| JP | A-2001-313537 | | 11/2001 | |
| JP | A-2002-111434 | | 4/2002 | |
| JP | A-2005-26843 | | 1/2005 | |
| JP | A-2005-94733 | | 4/2005 | |

OTHER PUBLICATIONS

Kawashima et al., "Lame-Mode Quartz Crystal Resonators Formed by an Etching Process," 24th EM Symposium, May 18, 1995, pp. 11-16 (with translation).

Mizumoto et al., Development of Small Sized Lame-Mode Quartz Crystal Resonators; 35th EM Symposium, May 18, 2006, pp. 31-34 (with translation).

* cited by examiner

*Primary Examiner* — Thomas M Dougherty
(74) *Attorney, Agent, or Firm* — Oliff & Berridge, PLC

(57) ABSTRACT

A contour resonator reducing fluctuation of resonance frequency due to variety of a film thickness of an excitation electrode is provided. A counter resonator includes a quartz substrate and excitation electrodes respectively formed on front and back surfaces of the quartz substrate. There is a range where a frequency sensitivity with respect to an electrode film thickness is smaller than that in related art when a ratio Fe/Fb between a contour vibration frequency Fe of the excitation electrodes and a contour vibration frequency Fb of the substrate is larger than 0.69. That is, fluctuation of the contour vibration frequency with respect to variety of the electrode film thickness can be made small substantially.

2 Claims, 6 Drawing Sheets

CONTOUR RESONATOR

TECHNICAL FIELD

The present invention relates to a contour resonator. In particular, the present invention relates to a structure of a substrate and an excitation electrode of a contour resonator.

BACKGROUND ART

As a reference signal source in a several MHz frequency band used for an electronic device such as a portable device, an information communication device, and a measurement equipment, a contour resonator such as an AT cut quartz crystal resonator, a DT cut quartz crystal resonator (a contour shear mode quartz crystal resonator), a Lame mode quartz crystal resonator, and a quasi Lame mode quartz crystal resonator can be cited.

The Lame mode quarts crystal resonator is formed such that a plurality of small excitation electrodes having a square shape are arranged in the longitudinal and the lateral directions on both surfaces of a square shaped crystal substrate. In the resonator, electric fields having opposite polarities are applied to adjacent small excitation electrodes so as to generate contour vibrations around boundary of a small vibrating part with reference to vibration nodes at four corners of each of the small excitation electrodes (Refer to Patent Citation 1, for example).

If an area for forming the small excitation electrodes is 50% or more of whole area of the small vibrating part in the Lame mode quartz crystal resonator, an equivalent resistance value has no problem practically. If the area is 70% or more, an enormous reduction effect of the equivalent resistance value can be expected. However, since a gap for forming an insulating pattern and a wiring pattern has to be ensured between the small vibration electrodes, the area is preferably 80% to 90%.

Further, a piezoelectric resonator in which excitation electrodes are provided on both front and back surfaces of a piezoelectric mother substrate vibrates in an area mode (Refer to Patent Citation 2, for example). The piezoelectric mother substrate is made of PZT®, quartz crystal, $LaTaO_3$, and the like. The excitation electrodes are made of Ag, Pd, Ni, Cu, Au, or those alloys.

Figure 10:
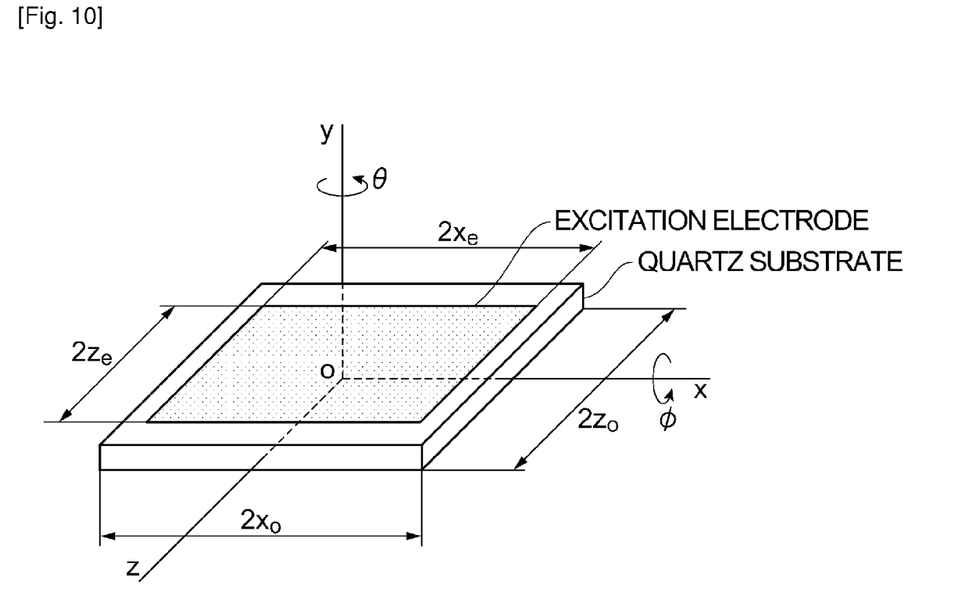
FIG. 10 is a perspective view showing a Lame mode quartz crystal resonator according to Patent Citation 1.

Non Patent Citation 1 discloses a Lame mode quartz crystal resonator expressed by (YX1t)phi/theta of IRE (abbreviation of Institute of Radio Engineers, that is, current IEEE) standard shown in FIG. 10. In terms of the resonator, a resonance frequency (contour vibration frequency) f of a quartz substrate is derived by a frequency equation shown in Math (9) of the citation. In addition, a resonance frequency of the excitation electrode can be derived from the frequency equation. Non Patent Citation 2 also mentions this.

Patent Citation 1: JP-A-2002-111434 (page 4, FIG. 1)
Patent Citation 2: JP-A-8-97667 (page 2-3, FIG. 8)
Non Patent Citation 1: "Lame-mode quartz-crystal resonator formed by an etching method" by Hirofumi Kawashima, and Masaru Matsuyama in the 24th EM symposium, page 11 to 16, Math (2), conditional clause and Math (9)
Non Patent Citation 2: "Development of a small-sized Lame-mode quartz-crystal resonator" by Katsuya Mizumoto, Masashi Akino, Tsuyoshi Nishizuka, Hideki Ashizawa, Masahide Marumo, and Masato Amemiya in the 35th EM symposium, page 31 to 34

DISCLOSURE OF INVENTION

Technical Problem

If Patent Citation 1 and Patent Citation 2 described above are combined, this contour resonator includes the excitation electrodes having an area of 50% or more of an area of the quartz substrate (the small vibrating part in Patent Citation 2) and made of any of Ag, Pd, Ni, Cu, and Au. However, an electrical resistance of Ni or Pd is four times or more as large as that of any one of Au, Ag, and Cu, so that a sheet resistance of the excitation electrodes is increased, increasing a resistance loss. Thus it is not practically preferable to use Ni or Pd.

Therefore, if a condition to use a low-resistance electrode film is added to the related art described above, it can be easily considered that the contour resonator has such structure that the excitation electrodes has an area that is 50% or more of the area of the quartz substrate (the small vibrating part in Patent Citation 2) and are made of any one of Ag, Cu, and Au.

Here, the area of the excitation electrodes is 50% or more of the area of the quartz substrate (the small vibrating part in Patent Citation 2), in other words, a ratio between a dimension of the excitation electrodes (a side length) and a dimension of the substrate (a side length) under a condition where a shape of the substrate is square, that is, the dimension of the excitation electrodes/the dimension of the substrate is 0.707 or more.

Though details will be described in a mode for the invention later, the following result was obtained by focusing and studying a ratio Fe/Fb between a contour vibration frequency Fe of the excitation electrode and a contour vibration frequency Fb of the quartz substrate; and a frequency sensitivity of the contour resonator. When the dimension of the excitation electrodes/the dimension of the substrate was 0.707 and the excitation electrodes were Cu electrodes, Fe/Fb became 0.69 and this Fe/Fb became closest to 1.0 among the related art described above. Then the frequency sensitivity with respect to the excitation electrodes increases to −6.8[Hz/0.0001 micrometer]. Therefore, there is a problem the resonance frequency of the contour resonator fluctuates depending on variation of the film thickness of the excitation electrodes.

The purpose of the present invention is to provide a contour resonator decreasing fluctuation of a resonance frequency due to variation of a film thickness of an excitation electrode.

Technical Solution

A contour resonator according to the present invention includes: a substrate; and an excitation electrode provided on each of front and back surfaces of the substrate. In the contour resonator, a ratio Fe/Fb between a contour vibration frequency Fe of the excitation electrode and a contour vibration frequency Fb of the substrate satisfies Fe/Fb>0.69.

According to the invention, if the frequency ratio is set to satisfy Fe/Fv>0.69, the absolute value of a frequency sensitivity with respect to the excitation electrode can be made smaller than −6.8[Hz/0.0001 micrometer] in Patent Citation 1. Further, fluctuation of the contour vibration frequency with respect to a film thickness of the excitation electrode can be reduced.

It is preferable that the ratio Fe/Fb between the contour vibration frequency Fe of the excitation electrode and the contour vibration frequency Fb of the substrate be in a range from 0.926 to 1.086.

If the frequency ratio Fe/Fb is set to be in the range from 0.926 to 1.086, the absolute value of a frequency sensitivity with respect to the excitation electrode can be made smaller than 2[Hz/0.0001 micrometer]. Further, fluctuation of the contour vibration frequency with respect to a film thickness of the excitation electrode can be reduced.

The contour resonator according to the present invention includes: a substrate; and an excitation electrode provided on each of front and back surfaces of the substrate. In the contour resonator, a ratio Le/Lb between a side length Le of the excitation electrode and a side length Lb of the substrate satisfies: 0<Le/Lb<0.53 in a case using one of Ag and an alloy mainly containing Ag for the excitation electrode; 0<Le/Lb<0.707 in a case using one of Cu and an alloy mainly containing Cu for the excitation electrode; 0<Le/Lb<0.38 in a case using one of Au and an alloy mainly containing Au for the excitation electrode; and 0<Le/Lb<1.0 in a case using one of Al and an alloy mainly containing Al for the excitation electrode.

According to the invention, in each electrode material, the absolute value of the frequency sensitivity with respect to the excitation electrode can be made smaller than −6.8[Hz/0.0001 micrometer] in Patent Citation 1 described above. Further, fluctuation of the contour vibration frequency with respect to the film thickness of the excitation electrode can be reduced.

Since the excitation electrode is made of a low resistance metal such as Ag, Cu, Au, and Al, the sheet resistance of the excitation electrode film can be reduced, being able to realize a low-loss contour resonator. In particular, Al is preferably used for the excitation electrode. In a case where Al is used for the excitation electrode, an area of the excitation electrode can be increased, being able to realize a low-loss contour resonator while keeping the frequency sensitivity with respect to the film thickness low.

It is preferable that Le/Lb be 0.37 plus/minus 0.07 in a case using one of Ag and an alloy mainly containing Ag for the excitation electrode; Le/Lb be 0.49 plus/minus 0.07 in a case using one of Cu and an alloy mainly containing Cu for the excitation electrode; Le/Lb be 0.26 plus/minus 0.07 in a case using one of Au and an alloy mainly containing Au for the excitation electrode; and Le/Lb be 0.88 plus/minus 0.07 in a case using one of Al and an alloy mainly containing Al for the excitation electrode.

By the above, the absolute value of the frequency sensitivity with respect to the excitation electrode can be made smaller than 2[Hz/0.0001 micrometer]. Further, fluctuation of the contour vibration frequency with respect to a film thickness of the excitation electrode can be reduced.

Since Ag, Cu, Au, and Al that have low resistance or an alloy mainly containing some of these is used for the excitation electrode in such structure as well, the sheet resistance of the excitation electrode film can be reduced, being able to realize a low-loss contour resonator. In particular, Al or an alloy mainly containing Al is preferably used. In a case where Al or an alloy mainly containing Al is used for the excitation electrode, an area of the excitation electrode can be increased, being able to realize a low-loss contour resonator while keeping the frequency sensitivity with respect to the film thickness low.

BEST MODE FOR CARRYING OUT THE INVENTION

A mode for the invention will now be described with reference to the accompanying drawings.

Figure 1:
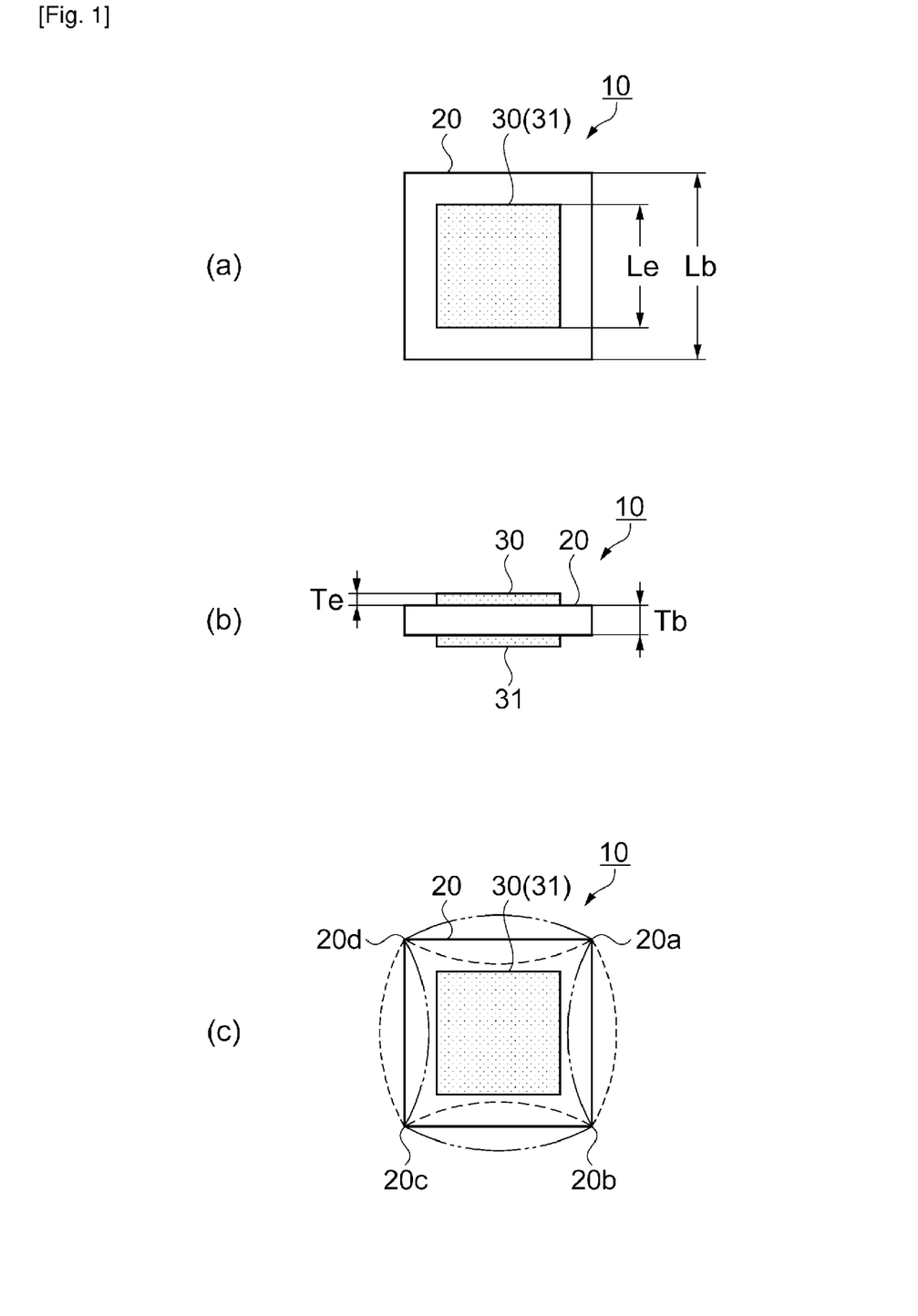
FIG. 1 schematically shows a contour resonator according to a mode for the invention.

FIG. 1 shows a structure of a contour resonator according to the mode for the invention. FIGS. 2 to 9 are graphs showing results of simulations. FIG. 10 is a perspective view showing a contour resonator of related art. Here, an LQ2T cut quartz substrate is illustrated as a substrate.

MODE FOR THE INVENTION

FIG. 1 schematically shows a contour resonator according to the mode for the invention. FIG. 1(a) is a plan view and FIG. 1(b) is a lateral view. In FIGS. 1(a) and 1(b), a contour resonator 10 is a Lame mode quartz crystal resonator including excitation electrodes 30, 31 respectively formed on front and back surfaces of a square shaped quartz substrate 20 thereof. The quartz substrate 20 is cut out in a square plate of which a cut angle is expressed by (YX1t)phi/theta of IRE standard. The present mode describes an LQ2T cut quartz crystal where phi is −51 degrees and theta is 45 degrees. Further, the quartz substrate 20 and the excitation electrodes 30, 31 are illustrated to have a square shape and respectively have a side length Lb and a side length Le.

The excitation electrodes 30, 31 are selected from such electrode materials as Al, Au, Ag, Cu, Pd, and Ni. However, Pd and Ni have an electrical resistivity about four times as large as that of Al, Au, Ag, and Cu, so that a sheet resistance of the excitation electrodes 30, 31 increases, increasing resistance loss. Thus Pd and Ni are not preferable to be used by single layer practically. Accordingly, the present mode selects Al, Au, Ag, and Cu having low resistivity.

Next, driving of the contour resonator 10 will be described.

FIG. 1(c) is an explanatory diagram schematically showing the driving of the contour resonator. In the contour resonator 10, if an excitation signal is applied to the excitation electrodes 30, 31, Lame mode vibration is excited. The Lame mode vibration has nodes at four corners 20a to 20d of the quartz substrate 20 and repeats an area vibration shown in a dashed-two dotted line and a dashed line. Therefore, a support beam is provided to some of the four corners 20a to 20d, though the illustration thereof is omitted. A contour vibration frequency of the contour resonator 10 is affected by an area and a film thickness of the excitation electrodes 30, 31.

Figure 2:
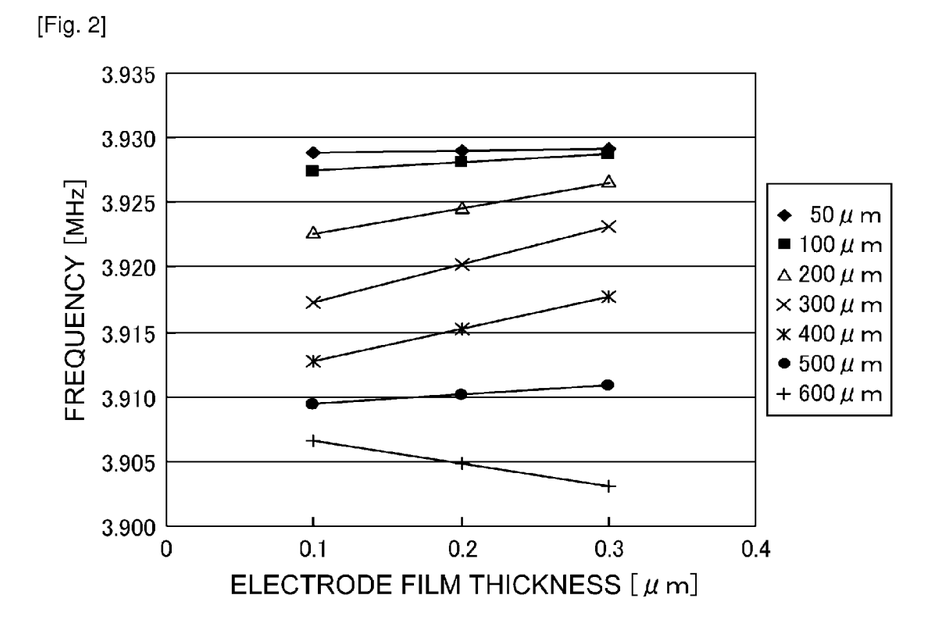
FIG. 2 is a graph showing a relation between an electrode film thickness and a frequency in a case where an excitation electrode of the contour resonator according to the mode for the invention is made of Al.
Figure 3:
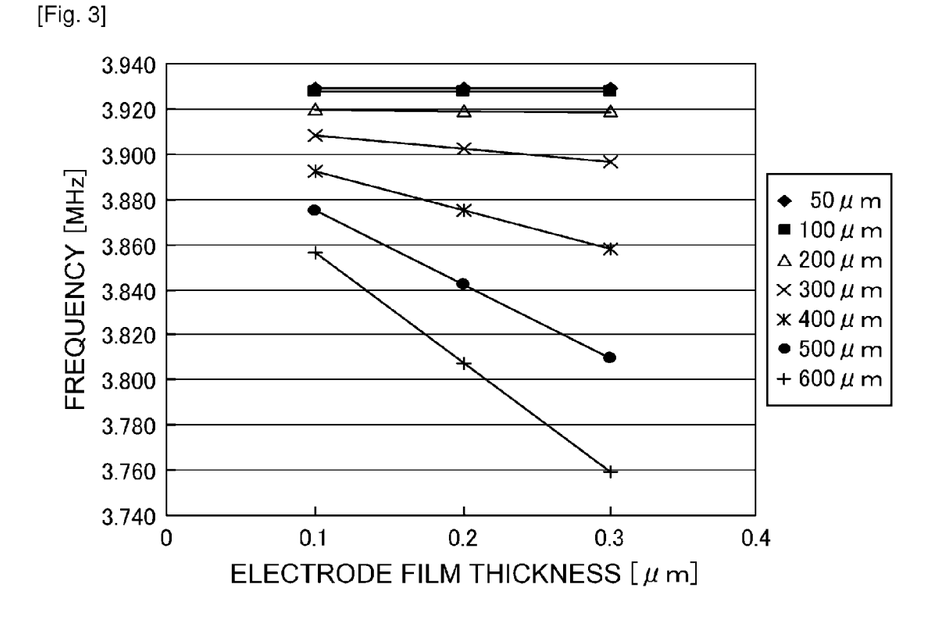
FIG. 3 is a graph showing a relation between an electrode film thickness and a frequency in a case where an excitation electrode of the contour resonator according to the mode for the invention is made of Au.
Figure 4:
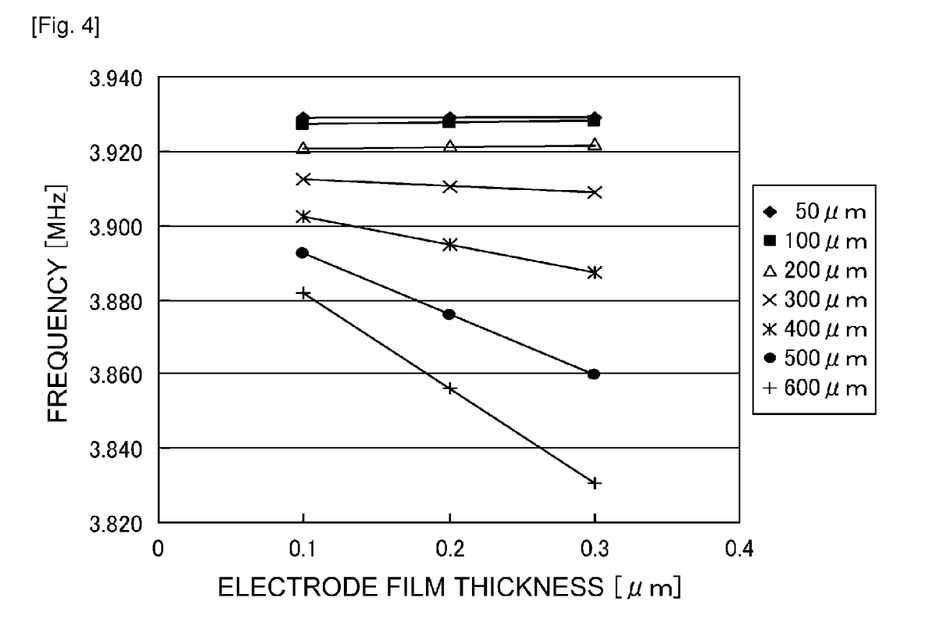
FIG. 4 is a graph showing a relation between an electrode film thickness and a frequency in a case where an excitation electrode of the contour resonator according to the mode for the invention is made of Ag.

FIGS. 2 to 4 are graphs showing a relation between the area and the film thickness of the excitation electrodes 30, 31 in the contour resonator 10 of the present mode. FIGS. 2 to 4 respectively show contour vibration frequencies in a case where the excitation electrodes 30, 31 are Al, in a case where the electrodes are Au, and in a case where the electrodes are Ag. Here, each figure shows a result that a fluctuation of the contour vibration frequency was simulated by FEM under the condition where the quartz substrate 20 has a square shape of which a length of one side is 600 micrometers, the excitation electrodes 30, 31 has a square shape of which a length of one side Lb is in a range from 50 micrometers to 600 micrometers, and the electrode film thickness is in a range from 0.1 micrometers to 0.4 micrometers.

FIG. 2 shows a case where the excitation electrodes 30, 31 are Al. The graph shows that as the electrode film thickness increases, the contour vibration frequency increases under a condition where the side length Le of the electrodes is in a range from 50 micrometers to 500 micrometers, and shows that the contour vibration frequency decreases under a condition where the side length Le of the electrodes is 600 micrometers.

FIG. 3 shows a case where the electrodes are Au. The graph shows that when the side length Le of the electrodes is in a range from 50 micrometers to 200 micrometers, the contour vibration frequency is hardly affected by the electrode film thickness, but if the side length is in a range from 300 micrometers to 600 micrometers, the frequency decreases as the electrode film thickness increases.

FIG. 4 shows a case where the electrodes are Ag. The graph shows that when the size of the electrodes is in a range from 50 micrometers to 200 micrometers, the contour vibration frequency is hardly affected by the electrode film thickness, but when the size is in a range from 300 micrometers to 600 micrometers, the contour vibration frequency decreases as the electrode film thickness increases.

Thus, the frequency sometimes increases or decreases while corresponding to a change of the electrode film thickness depending on the plane size of the electrodes 30, 31 in each material of the electrodes, as shown in FIGS. 2 to 4. Though a data of a case where the excitation electrodes are Cu is not shown, it can be presumed that a relation between the contour vibration frequency and the electrode film thickness is close to that of Al, Ag, and Au. From these results, an inclination of the change of the contour vibration frequency with respect to the electrode film thickness is defined as a frequency sensitivity and a relation between the plane size of the excitation electrodes (side length Le of the excitation electrodes) of each electrode material and the frequency sensitivity was researched.

Figure 5:
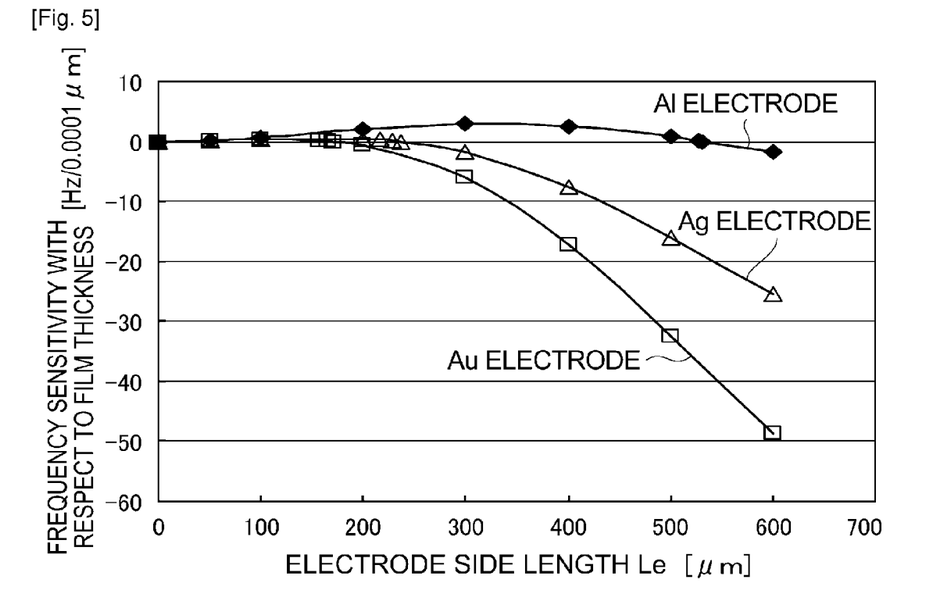
FIG. 5 is a graph showing a relation between a side length Le of an excitation electrode and a frequency sensitivity with respect to an electrode film thickness according to the mode for the invention.

FIG. 5 is a graph showing a relation between the side length Le of the excitation electrodes 30, 31 and the frequency sensitivity with respect to the electrode film thickness. Referring to FIG. 5, it was found that there is a region where the frequency sensitivity with respect to the electrode film thickness becomes "0" depending on the side length Le of the excitation electrodes in terms of the excitation electrodes of each material of Al, Au, and Ag. The frequency sensitivity with respect to the electrode film thickness is "0", that is, even if the electrode film thickness fluctuates, corresponding frequency fluctuation hardly occurs.

Here, when the contour vibration frequency (resonance frequency) Fe of the excitation electrodes 30, 31 and the contour vibration frequency (resonance frequency) Fb have a relation of Fe=Fb, that is, the contour vibration frequency of the excitation electrodes equates to that of the quartz substrate, the frequency sensitivity is "0". Therefore, a relation between the contour vibration frequency of the excitation electrodes and that of the quartz substrate where the frequency sensitivity becomes closest to "0" in terms of each material of the excitation electrodes will be derived.

A frequency equation for evaluating a resonance frequency (f) of the Lame mode quartz crystal resonator is given by Non Patent Citation 1 described above (Non Patent Citation 1, page 12, Math (9)). FIG. 10 is also referred.

[Math. 1]

$$f = \frac{m}{2(2x_o)}\sqrt{\frac{c'_{11}-c'_{13}}{\rho}} = \frac{n}{2(2z_o)}\sqrt{\frac{c'_{11}-c'_{13}}{\rho}} \quad (1)$$

Here, rho is a density of quartz crystal, $C'_{11}$ and $C'_{13}$ are constant numbers derived by converting an elastic constant (elastic stiffness constant) Cpq in accordance with Non Patent Citation 1 (page 11, conditional clause of Math (2)), m=n=1, $2x_o$ is a length of a lateral side of the quartz substrate, and $2z_o$ is a length of the longitudinal side. The resonance frequency of the excitation electrodes can be also evaluated by the same frequency equation. The side length of the quartz substrate 20 satisfies Lb=$2x_o$=$2z_o$, and the side length of the excitation electrodes 30, 31 satisfies Le=2xe=2ze in the present mode.

Further, Math 1 expresses that even if the quartz substrate 20 and the excitation electrodes 30, 31 are rectangular (even if a length of the lateral side is integral multiple of that of the longitudinal side, for example), Math 1 works out.

With this frequency quotation, a ratio Le/Lb of the side length Le of the excitation electrodes and the side length Lb of the quartz substrate is evaluated when the contour vibration frequency (resonance frequency) Fb of the quartz substrate equates to the contour frequency (resonance frequency) Fe of the excitation electrodes. Then the result is shown in Table 1 and FIG. 6.

Figure 6:
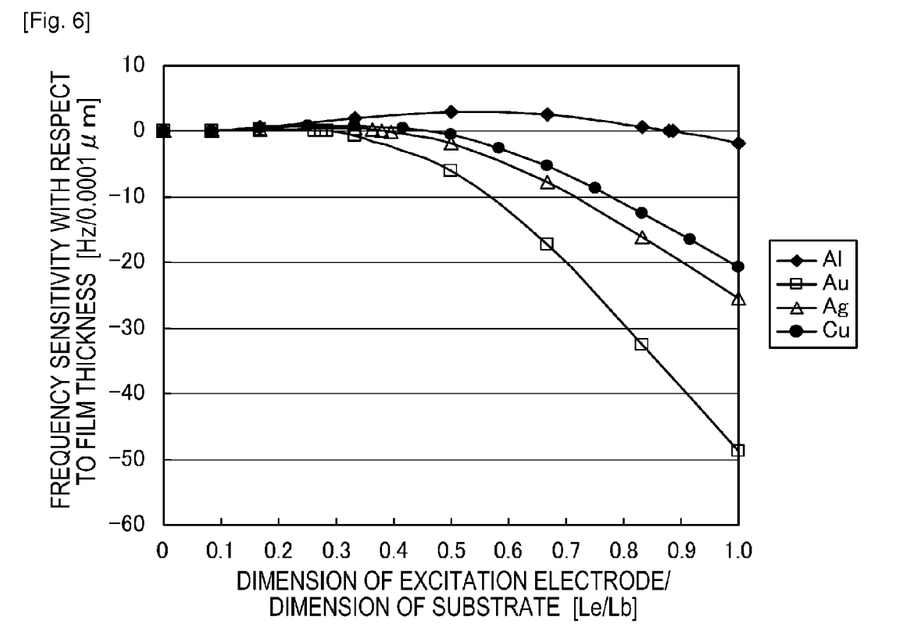
FIG. 6 is a graph showing a relation between Le/Lb and a frequency sensitivity with respect to an electrode film thickness according to the mode for the invention.

FIG. 6 is a graph showing a relation between Le/Lb and the frequency sensitivity with respect to the electrode film thickness.

TABLE 1

| Material of electrode | Elastic constant [×10$^{11}$ N/m$^2$] $c_{11}'$ | $c_{13}'$ | Mass density [kg/m$^3$] | Frequency constant [Hz-m] | (A) Le/Lb @Fe = Fb | (B) Lb or Le @Fe = Fb [micrometer] | Resonance frequency [MHz] |
|---|---|---|---|---|---|---|---|
| LQ2T cut quartz crystal | 0.781 | 0.198 | 2650 | 2344 | 1.00 | Lb = 600 | 3.907460901 |
| Al | 0.726 | 0.266 | 2699 | 2064 | 0.88 | Le = 528 | 3.907460901 |
| Ag | 0.542 | 0.232 | 10490 | 860 | 0.37 | Le = 220 | 3.907460901 |
| Au | 0.536 | 0.246 | 19302 | 613 | 0.26 | Le = 157 | 3.907460901 |
| Pd | 0.889 | 0.389 | 12023 | 1020 | 0.43 | Le = 261 | 3.907460901 |
| Ni | 1.611 | 0.603 | 8908 | 1682 | 0.72 | Le = 430 | 3.907460901 |
| Cu | 0.808 | 0.339 | 8920 | 1147 | 0.49 | Le = 294 | 3.907460901 |

In Table 1, (A) shows a value of Le/Lb when Fe=Fb is satisfied, and (B) shows Lb or Le when Fe=Fb is satisfied. The side length Lb of the quartz substrate 20 is set to be 600 micrometers. Referring to Table 1 and FIG. 6, Le/Lb when the contour vibration frequencies of the quartz substrate equates to that of the excitation electrodes is 0.88 in a case where the excitation electrodes are Al, 0.37 in a case where the excitation electrodes are Ag, 0.26 in a case where the electrodes are Au, and 0.49 in a case where the electrodes are Cu. When Le/Lb is abo in each electrode material, the frequency sensitivity with respect to the electrode film thickness becomes "0". Namely, the contour vibration frequency does not fluctuate with respect to variation of the electrode film thickness.

From a synthesis of Patent Citation 1 and Patent Citation 2 described above, the Lame mode quartz crystal resonator is preferably structured such that an area of the excitation electrodes is 50% or more of an area of the quartz substrate (vibrating part) and the excitation electrodes are made of any of Ag, Cu, and Au. The area of the excitation electrodes is 50% or more of the area of the quartz substrate (vibrating part), that is, in a case where the quartz substrate and the excitation electrodes have a square shape, Le/Lb is 0.707 or more.

If Fe/Fb is calculated by Math 1 under a condition where the excitation electrodes are Cu and Le/Lb is 0.707, Fe/Fb becomes 0.69. The frequency sensitivity with respect to electrode film thickness when Fe/Fb is 0.69 becomes −6.8 [Hz/0.001 micrometer]. Thus there is a problem that the contour vibration frequency (resonance frequency) of the contour resonator largely fluctuates depending on the film thickness of the excitation electrodes.

Therefore, Le/Lb when Fe/Fb becomes 0.69 is calculated in each material of the excitation electrodes so as to find a region Fe/Fb becomes more than 0.69, being able to find an improved region compared to the frequency sensitivity −6.8 [Hz/0.0001 micrometer] with respect to the electrode film thickness of related art.

Figure 7:
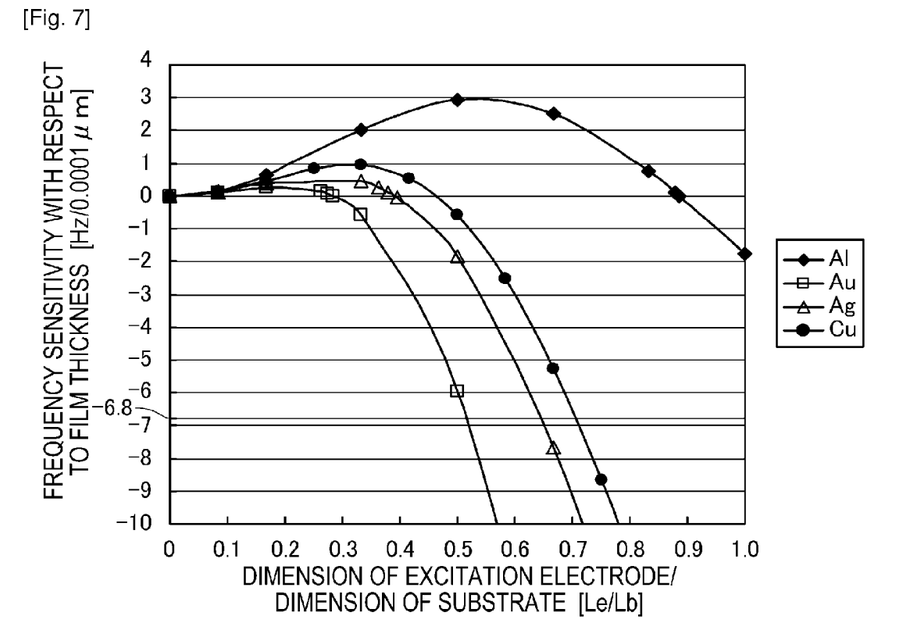
FIG. 7 is a graph showing a relation between Le/Lb and a frequency sensitivity with respect to an electrode film thickness according to the mode for the invention.

Table 2 shows Le/Lb when Fe/Fb becomes 0.69 in each material of the excitation electrodes and FIG. 7 shows a relation between Le/Lb and the frequency sensitivity with respect to the electrode film thickness. Here, FIG. 7 is drawn by enlarging the longitudinal axis of FIG. 6.

TABLE 2

| Material of electrode | Le/Lb when Fe/Fb = 0.69 is satisfied |
|---|---|
| Ag | 0.53 |
| Cu | 0.71 |
| Au | 0.38 |
| Al | 1.28 |

Table 2 shows Le/Lb when Fe/Fb becomes 0.69 in each material of the excitation electrodes. When the excitation electrodes are Ag, Au, Al, and Cu, Le/Lb are respectively 0.53, 0.38, 1.28, and 0.707.

Referring to FIG. 7, a range where the frequency sensitivity with respect to the electrode film thickness satisfies a better condition than −6.8[Hz/0.0001 micrometer] in related art is the following: 0<Le/Lb<0.53 in a case using Ag as the excitation electrodes, 0<Le/Lb<0.707 in a case of Cu, 0<Le/Lb<0.38 in a case of Au, and 0<Le/Lb<1.0 in a case of Al. When the excitation electrode is Al, Le/Lb=1.28 is derived in calculation, but Le practically equals to Lb at the maximum. Here, in a case where Al is used for the excitation electrode, an area of the excitation electrodes can be increased while keeping low frequency sensitivity with respect to the electrode film thickness, being able to realize a low-loss contour resonator.

Subsequently, a range of Le/Lb with which the frequency sensitivity with respect to the electrode film thickness is improved will be described with reference to Table 3 and FIG. 8.

Table 3 shows a range where an absolute value of the frequency sensitivity with respect to the electrode film thickness is 2[Hz/0.0001 micrometer] or less. FIG. 8 is a graph showing a relation between Le/Lb and the frequency sensitivity with respect to the electrode film thickness.

TABLE 3

| Material of electrode | Elastic constant [×10¹¹ N/m²] $c_{11}'$ | $c_{13}'$ | Mass density [kg/m³] | (A) Le/Lb @Fe = Fb | (B) Lb or Le @Fe = Fb [micrometer] | Resonance frequency [MHz] | Fe/Fb |
|---|---|---|---|---|---|---|---|
| LQ2T cut quartz crystal | 0.781 | 0.198 | 2650 | 1.00 | Lb = 600 | 3.907461 | — |
| Al | 0.726 | 0.266 | 2699 | 0.88 | Le = 528 | 3.907461 | 1.000 |
| Al | 0.726 | 0.266 | 2699 | 0.95 | Le = 570 | 3.619677 | 0.926 |
| Al | 0.726 | 0.266 | 2699 | 0.81 | Le = 486 | 4.244958 | 1.086 |
| Ag | 0.542 | 0.232 | 10490 | 0.37 | Le = 220 | 3.907461 | 1.000 |
| Ag | 0.542 | 0.232 | 10490 | 0.44 | Le = 262 | 3.281008 | 0.840 |
| Ag | 0.542 | 0.232 | 10490 | 0.30 | Le = 178 | 4.829588 | 1.236 |
| Au | 0.536 | 0.246 | 19302 | 0.26 | Le = 157 | 3.907461 | 1.000 |
| Au | 0.536 | 0.246 | 19302 | 0.33 | Le = 199 | 3.082132 | 0.789 |
| Au | 0.536 | 0.246 | 19302 | 0.19 | Le = 115 | 5.336448 | 1.366 |
| Cu | 0.808 | 0.339 | 8920 | 0.49 | Le = 294 | 3.907461 | 1.000 |
| Cu | 0.808 | 0.339 | 8920 | 0.56 | Le = 336 | 3.418493 | 0.875 |
| Cu | 0.808 | 0.339 | 8920 | 0.42 | Le = 252 | 4.559657 | 1.167 |

In Table 3, (A) shows a value of Le/Lb in a condition of Fe=Fb, and (B) shows a value of Lb or Le in a condition of Fe=Fb.

Referring to Table 3, in terms of each material of electrodes, the upper row shows a center value of Fe/Fb (that is, FE=Fb), the middle row shows a lower limit, and the lower row shows an upper limit. Accordingly, it is shown that when Al, Ag, Au, and Cu are used for the excitation electrode, the absolute value of the frequency sensitivity with respect to the electrode film thickness can be kept 2[Hz/0.0001 micrometer] or less with any material as long as 0.926<Fe/Fb<1.086 is satisfied. That is, it is shown that variation of the contour vibration frequency can be reduced with respect to variation of the thickness of the excitation electrodes.

Figure 8:
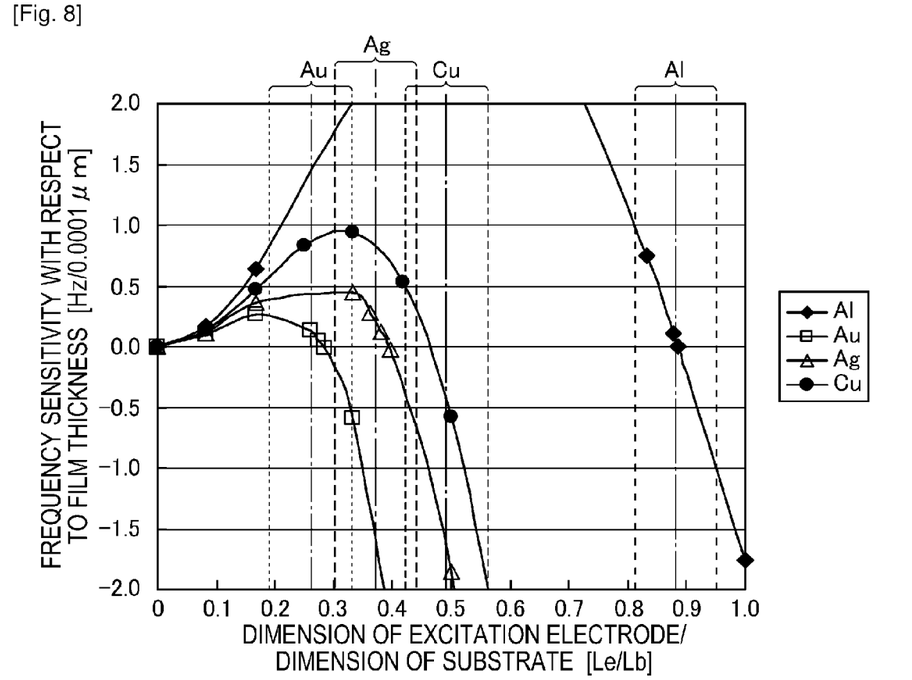
FIG. 8 is a graph showing a relation between Le/Lb and a frequency sensitivity with respect to an electrode film thickness according to the mode for the invention.

FIG. 8 is a graph showing a relation between Le/Lb and the frequency sensitivity with respect to the electrode film thickness. The longitudinal axis of FIG. 7 is further enlarged. Table 3 and FIG. 8 show that the absolute vale of the frequency sensitivity with respect to the electrode film thickness becomes 2[Hz/0.0001 micrometer] or less if a range of Le/Lb of the excitation electrodes 30, 31 with respect to each material is 0.88 plus/minus 0.07 in a case using Al for the excitation electrodes, 0.26 plus/minus 0.07 in a case of Au, 0.37 plus/minus 0.07 in a case of Ag, and 0.49 plus/minus 0.07 in a case of Cu.

According to the mode for the invention described above, if the frequency ratio between the excitation electrodes 30, 31 and the quartz substrate 20 is set to satisfy Fe/Fv>0.69, the absolute value of the frequency sensitivity with respect to the excitation electrodes can be made smaller than −6.8[Hz/0.0001 micrometer] in Patent Citation 1. Further, fluctuation of the contour vibration frequency with respect to the film thickness of the excitation electrodes can be made small.

Further, if the ratio Fe/Fb between the contour vibration frequency Fe of the excitation electrodes 30, 31 and the contour vibration frequency Fb of the quartz substrate 20 is set to be in a range from 0.926 to 1.086, the absolute value with respect to the film thickness of the excitation electrodes can be made smaller than 2[Hz/0.0001 micrometer]. In addition, fluctuation of the contour vibration frequency with respect to the film thickness of the excitation electrodes can be further reduced.

In addition, if the ratio Le/Lb between the side length Le of the excitation electrodes 30, 31 and the side length Lb of the quartz substrate is set to be: 0<Le/Lb<0.53 in a case using Ag for the excitation electrodes, 0<Le/Lb<0.707 in a case of Cu, 0<Le/Lb<0.38 in a case of Au, and 0<Le/Lb<1.0 in a case of Al, the absolute value can be made smaller than −6.8[Hz/0.0001 micrometer] in Patent Citation 1. Further, fluctuation of the contour vibration frequency with respect to the film thickness of the excitation electrodes can be reduced.

If the excitation electrodes 30, 31 are made of a low resistance metal such as Ag, Cu, Au, and Al, the sheet resistance of the excitation electrode film can be reduced, being able to realize a low-loss contour resonator.

If Le/Lb is set to be 0.37 plus/minus 0.07 in a case using Ag for the excitation electrodes, 0.49 plus/minus 0.07 in a case of Cu, 0.26 plus/minus 0.07 in a case of Au, and 0.88 plus/minus 0.07 in a case of Al, the absolute value of the frequency sensitivity with respect to the film thickness of the excitation electrodes in each material can be made smaller than 2[Hz/0.0001 micrometer]. Further, fluctuation of the contour vibration frequency with respect to the film thickness of the excitation electrodes can be reduced.

Since a low resistance metal such as Ag, Cu, Au, and Al is used for the excitation electrodes 30, 31 in such structure as well, the sheet resistance of the excitation electrode film can be reduced, being able to realize a low-loss contour resonator.

It should be understood that the invention is not limited to the above-mentioned mode. Various modifications and improvements can be made without departing from the spirit and scope of the invention.

For example, while the Lame mode quartz crystal resonator is illustrated as the contour resonator in the mode described above, the invention can be applied to a DT cut quartz crystal resonator (a contour shear mode quartz crystal resonator); a longitudinal crystal resonator; a width-length coupling quartz crystal resonator; and a quasi Lame mode quartz crystal resonator. Also, the invention can be applied to a substrate made of a piezoelectric material (for example, piezoelectric ceramic, $LaTa_3$) other than quartz crystal.

Figure 9:
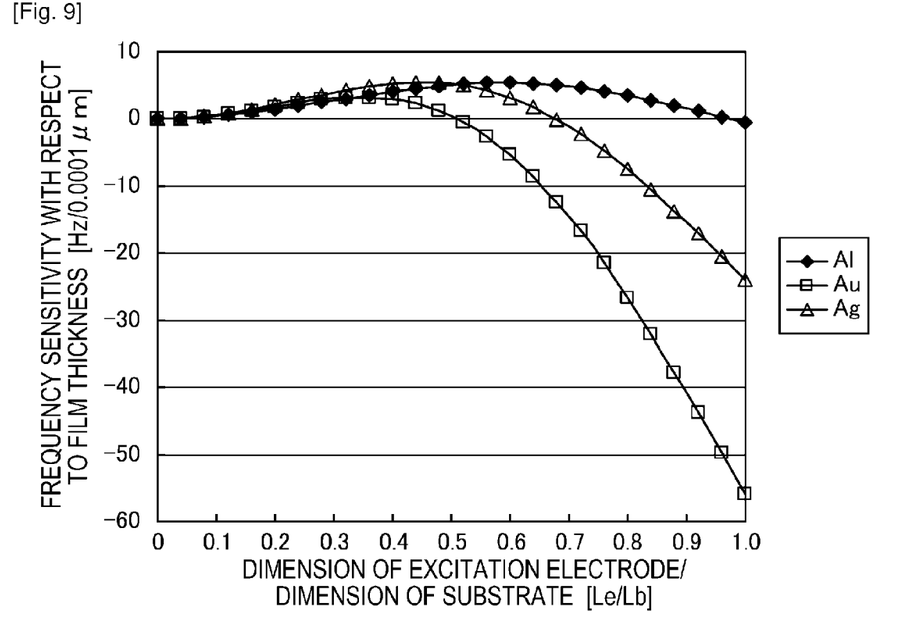
FIG. 9 is a graph showing a relation between Le/Lb and a frequency sensitivity with respect to an electrode film thickness of a DT cut quartz crystal resonator.

FIG. 9 illustrates a relation between Le/Lb of a DT cut quartz crystal resonator and a frequency sensitivity with respect to an electrode film thickness. FIG. 9 shows that there is a range where the frequency sensitivity with respect to the electrode film thickness becomes "0" in each material when the excitation electrodes are made of Al, Au, and Ag.

Further, the invention can use an alloy mainly containing Ag, Cu, Au, and Al as a material of the excitation electrodes; and use Ag, Cu, Au, and Al or an alloy mainly containing Ag, Cu, Au, and Al as a main electrode film of layered electrode films. The invention is applicable to such structure that an Au film is formed as a main electrode on a surface of an underlayer film that is made of Cr or Ni. The Au film has a larger film thickness than the underlayer film.

Further, in a case where the substrate and/or the excitation electrode have a lamination structure, the advantageous effect of the present invention can be obtained by nearly synchronizing contour vibration frequencies of at least two layers of the lamination.

Further, in a case where a piezoelectric thin film made of ZnO or AlN is formed on the substrate, it is enough to synchronize a contour vibration frequency of a piezoelectric thin film layer and that of the substrate and/or the excitation electrode.

Furthermore, the present invention is applicable to a silicon MEMS contour resonator as well as the piezoelectric contour resonator.

BRIEF DESCRIPTION OF THE DRAWINGS

FIG. 1(a) is a planar view, FIG. 1(b) is a lateral view, and FIG. 1(c) is a schematic explanatory diagram.

EXPLANATION OF REFERENCE

10: contour resonator, 20: quartz substrate, 30, 31: excitation electrodes

The invention claimed is:

1. A contour resonator, comprising:
a substrate; and
an excitation electrode provided on each of front and back surfaces of the substrate, wherein
a ratio Fe/Fb between a contour vibration frequency Fe of the excitation electrode and a contour vibration frequency Fb of the substrate satisfies Fe/Fb>0.69.

2. The contour resonator according to claim 1, wherein the ratio Fe/Fb between the contour vibration frequency Fe of the excitation electrode and the contour vibration frequency Fb of the substrate is in a range from 0.926 to 1.086.

* * * * *